(12) United States Patent
Madurawe

(10) Patent No.: US 7,064,579 B2
(45) Date of Patent: Jun. 20, 2006

(54) ALTERABLE APPLICATION SPECIFIC INTEGRATED CIRCUIT (ASIC)

(75) Inventor: Raminda Udaya Madurawe, Sunnyvale, CA (US)

(73) Assignee: Viciciv Technology, Sunnyvale, CA (US)

(*) Notice: Subject to any disclaimer, the term of this patent is extended or adjusted under 35 U.S.C. 154(b) by 88 days.

(21) Appl. No.: 10/872,594

(22) Filed: Jun. 22, 2004

(65) Prior Publication Data

US 2004/0222817 A1    Nov. 11, 2004

Related U.S. Application Data

(63) Continuation-in-part of application No. 10/267,483, filed on Oct. 8, 2002.

(60) Provisional application No. 60/397,070, filed on Jul. 22, 2002, provisional application No. 60/393,763, filed on Jul. 8, 2002.

(51) Int. Cl.
*H03K 19/177* (2006.01)

(52) U.S. Cl. .................. 326/39; 326/47; 326/101; 326/38; 326/37; 326/40; 326/41; 257/202; 257/298; 257/209; 257/686

(58) Field of Classification Search .......... 257/298, 257/292, 299, 296; 716/16; 326/39
See application file for complete search history.

(56) References Cited

U.S. PATENT DOCUMENTS

| | | | |
|---|---|---|---|
| 5,563,526 A | 10/1996 | Hastings et al. | |
| 5,581,501 A | 12/1996 | Sansbury et al. | |
| 5,625,221 A | 4/1997 | Kim et al. | |
| 5,679,967 A | 10/1997 | Janai et al. | |
| 5,835,405 A | 11/1998 | Tsui et al. | |
| 5,844,422 A | 12/1998 | Trimberger et al. | |
| 5,943,574 A | 8/1999 | Tehrani et al. | |
| 5,949,710 A | 9/1999 | Pass et al. | |
| 6,018,476 A | 1/2000 | Madurawe et al. | |
| 6,097,211 A | 8/2000 | Couts-Martin et al. | |
| 6,134,173 A | 10/2000 | Cliff et al. | |
| 6,242,767 B1 | 6/2001 | How et al. | |
| 6,331,784 B1 | 12/2001 | Mason et al. | |
| 6,331,789 B1 | 12/2001 | Or-Bach | |
| 6,448,808 B1 | 9/2002 | Young et al. | |
| 6,504,742 B1 | 1/2003 | Tran et al. | |
| 6,515,511 B1 | 2/2003 | Sugibayashi et al. | |
| 6,582,980 B1 | 6/2003 | Feldman et al. | |
| 6,613,611 B1 | 9/2003 | How et al. | |
| 6,627,985 B1 | 9/2003 | Huppenthal et al. | |

(Continued)

OTHER PUBLICATIONS

Ashok K. Sharma, "Programmable Logic Handbook—PLDs, CPLDs, & FPGAs", 1998, pp. 99-171, McGraw-Hill, USA.

*Primary Examiner*—Nathan J. Flynn
*Assistant Examiner*—Fazli Erdem

(57) ABSTRACT

A highly economical alterable ASIC contains multiple fully optimized custom ASIC designs in one IC foot-print, each design utilizing the entire IC. The user can switch between multiple independently stored optimized logic applications instantly. The alterable ASIC comprises programmable logic blocks and user configurable circuits. Either random access memory (RAM) configuration circuits or mask configured read only memory (ROM) configuration circuits are stacked in separate module layers above a single logic module layer. Each RAM or ROM layer implements one design application and global control signals provide user selection. Alterable ASIC dissever the effective die cost, requires one smaller package, occupies one site on the PC board and needs less board level wires. An extremely low cost solution for system designs is realized with an alterable ASIC.

20 Claims, 9 Drawing Sheets

U.S. PATENT DOCUMENTS

| | | | |
|---|---|---|---|
| 6,747,478 B1 * | 6/2004 | Madurawe | 326/39 |
| 6,992,503 B1 * | 1/2006 | Madurawe | 326/39 |
| 2001/0003428 A1 | 6/2001 | Or-Bach | |
| 2001/0047509 A1 | 11/2001 | Mason et al. | |
| 2003/0023762 A1 | 1/2003 | Dhir et al. | |
| 2004/0196065 A1 * | 10/2004 | Madurawe | 326/41 |

* cited by examiner $O_1 = A*B*/C + /A*B$
$O_2 = /A*B + /B*C$
$O_3 = A*B*/C + /A*B + C$
$O_4 = C$

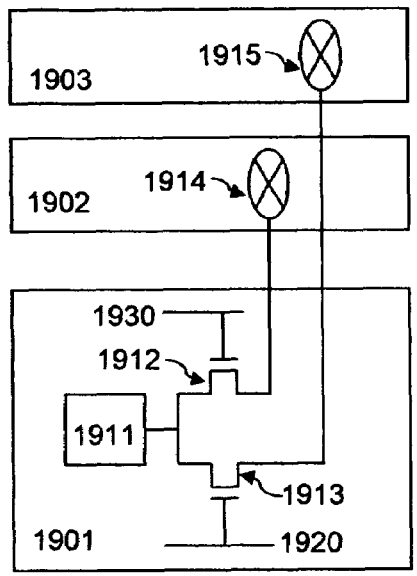
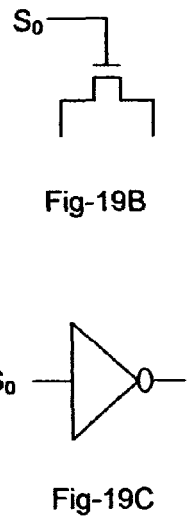
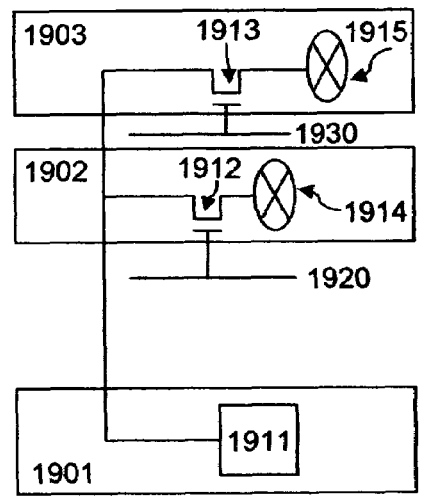
Fig-19A  Fig-19B  Fig-19C  Fig-19D
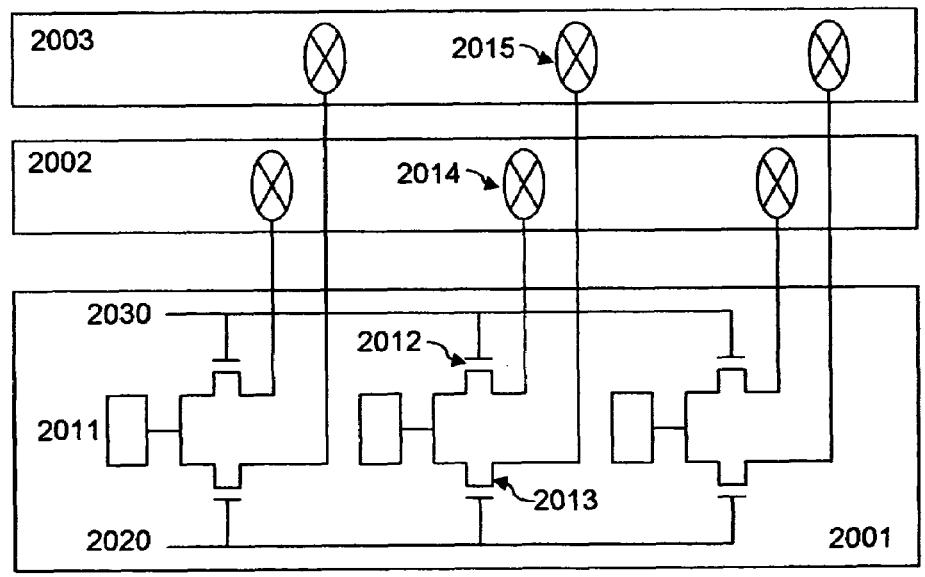
Fig-20

ALTERABLE APPLICATION SPECIFIC INTEGRATED CIRCUIT (ASIC)

This application is a continuation-in-part of application Ser. No. 10/267,483 filed on Oct. 8, 2002, which claims priority from Provisional Application Ser. No. 60/393,763 filed on Jul. 8, 2002, and Provisional Application Serial No. 60/397,070 filed on Jul. 22, 2002, all of which have as inventor Mr. R. U. Madurawe and the contents of which are incorporated-by-reference.

This application is related to application Ser. No. 10/267,484 and application Ser. No. 10/267,511, both filed on Oct. 8, 2002, and list as inventor Mr. R. U. Madurawe, the contents of which are incorporated-by-reference. This application is also related to application Ser. No. 10/846,699 filed on May 17, 2004, which is a continuation of application Ser. No. 10/267,483, and list as inventor Mr. R. U. Madurawe, the contents of which are incorporated herein by reference.

BACKGROUND

The present invention relates to multi-dimensional integrated circuits. More specifically, it relates to a highly economical single IC that holds multiple fully optimized custom ASIC designs, each design utilizing the entire IC, wherein the user can switch between applications instantly.

Traditionally, integrated circuit (IC) devices such as custom, semi-custom, or application specific integrated circuit (ASIC) devices have been used in electronic products to reduce cost, enhance performance or meet space constraints. However, the design and fabrication of custom or semi-custom ICs can be time consuming and expensive. The customization involves a lengthy design cycle during the product definition phase and high Non Recurring Engineering (NRE) costs during manufacturing phase. Further, should design errors exist in the custom or semi-custom ICs, the design/fabrication cycle has to be repeated, further aggravating the time to market and engineering cost. As a result, ASICs serve only specific high volume and low cost applications. Each ASIC comprises a customized interconnect structure that mandates a unique construction for a specific application. If multiple applications are designed to share a single IC, the ASIC foot-print has to grow to incorporate multiple designs into one larger design, thus increasing the cost and complexity of the IC.

Another type of semi custom device called a Gate Array customizes wiring for pre arranged modular logic blocks at a lower NRE cost by synthesizing the design using a software model similar to the ASIC. The absence of silicon level design verification results in multiple spins and lengthy design iterations. A more recent trend in ICs named Array ASICs offer larger pre arranged modular blocks for the user to customize compared to a Gate Array. Larger blocks are easier to route. They both involve a customized interconnect pattern, and useful only for a single application. Similar to ASICs, a larger Array IC foot-print is needed to incorporate multiple design applications in a single IC. Larger designs are slower, more difficult on timing convergence, and takes longer to place and route.

In recent years there has been a move away from custom or semi-custom ICs towards field programmable components whose function is determined not when the integrated circuit is fabricated, but by an end user "in the field" prior to use. Off the shelf, generic Programmable Logic Device (PLD) or Field Programmable Gate Array (FPGA) products greatly simplify the design cycle. These products offer user-friendly software to fit custom logic into the device through programmability, and the capability to tweak and optimize designs to optimize silicon performance. The flexibility of this programmability is expensive in terms of silicon real estate, but reduces design cycle and upfront NRE cost to the designer.

FPGAs offer the advantages of low non-recurring engineering costs, fast turnaround (designs can be placed and routed on an FPGA in typically a few minutes), and low risk since designs can be easily amended late in the product design cycle. It is only for high volume production runs that there is a cost benefit in using the more traditional approaches. However, the conversion from an FPGA implementation to an ASIC implementation typically requires a complete redesign. Such redesign is undesirable in that the FPGA design effort is wasted.

Compared to PLD and FPGA, an ASIC has hard-wired logic connections, identified during the chip design phase, and need no configuration memory cells. This is a large chip area and cost saving for the ASIC. Smaller ASIC die sizes lead to better performance. A full custom ASIC also has customized logic functions which take less gate counts compared to PLD and FPGA configurations of the same functions. Thus, an ASIC is significantly smaller, faster, cheaper and more reliable than an equivalent gate-count PLD or FPGA. The trade-off is between time-to-market (PLD and FPGA advantage) versus low cost and better reliability (ASIC advantage).

There is no convenient migration path from a PLD or FPGA used as a design verification and prototyping vehicle to the lower die size ASIC. All of the SRAM or Anti-fuse configuration bits and programming circuitry has no value to the ASIC. Programmable module removal from the PLD or FPGA and the ensuing layout and design customization is time consuming with severe timing variations from the original design.

One FPGA can implement multiple logic designs. Each design is identified by a bit-map pattern that specifies how all the internal programmable logic elements are to be arranged to fit the design in the FPGA. These bits are stored on-chip as configuration memory. To switch between applications, the entire bit pattern or intelligently identified portion of the bit pattern must be changed. For non-volatile configuration memory (such as EPROM, EEPROM, Flash), these erase, re-program & verify cycles are very time consuming. For volatile memory (such as SRAM) a duplicate non-volatile memory must exist outside of the chip to load the desired pattern during power up, and to change it to the new pattern when desired. That too is time consuming as chip to chip data bandwidth limitations and system processor loading hinder the action. Duplicating the configuration memory content to hold two patterns adds to the foot-print of the already expensive FPGA. Hence only single applications are implemented in production on FPGAs today.

SUMMARY

In one aspect, a three-dimensional semiconductor device, comprises: a first module layer having a plurality of circuit blocks; and a second module layer positioned substantially above the first module layer, including a plurality of first configuration circuits to control a portion of the circuit blocks; and a third module layer positioned substantially above the second module layer, including a plurality of second configuration circuits to control said portion of the circuit blocks; and one or more global control signals to instantly select all configuration circuits in one of said modules to control said portion of the circuit blocks.

Implementations of the above aspect may include one or more of the following. The configuration circuits can contain memory elements. Each memory element can be a transistor or a diode or a group of electronic devices. The memory elements can be comprised of thin film devices such as thin film transistors (TFT) or diodes. The memory elements can be user configurable random access memory (RAM) elements. The memory elements can be mask configured read only memory (ROM) elements. The memory element can be selected from the group consisting of volatile or non volatile memory elements. The memory element can also be selected from the group of fuses, antifuses, SRAM cells, DRAM cells, metal optional links, EPROMs, EEPROMs, flash, carbon nano-tubes and ferro-electric elements. The memory elements can also be a conductive pattern comprising metal connections or via connections to power and ground supply voltages. One or more redundant memory cells can be provided for controlling the same circuit block. A fourth module layer can be formed substantially above the first and second module layer, wherein interconnect and routing signals are formed to connect the circuit blocks within the first, second and third module layers. The fourth module layer can be formed substantially below the second and third module layer, but above the first module layer to connect the circuit blocks within the first, second and third module layers. Alternatively, fourth and fifth module layers, wherein interconnect and routing signals are formed can be positioned above and below the second and third module layer respectively. The circuit block can contain a programmable logic block which responds to input data signals and develops corresponding complete or partial output logic signals, and registers to store the logic signals and either outputting them to output terminals or returning them as inputs to additional programmable logic blocks. The programmable logic blocks can contain pass gate logic, inverters, multiplexer logic, truth table logic, or AND/OR logic blocks.

Implementations of the above aspect may further include one or more of the following. The memory can be implemented using a TFT process technology that contains one or more of replaceable Fuses, Anti-fuses and SRAM elements. The process implementation is possible with any process technology where EPROM, EEPROM, Flash, Ferro-Electric, Electro-Magnetic or any other programmable element is vertically integrated. The memory can be implemented using metal customization during mask making process, wherein metal wires are coupled to a power bus to generate logic one data, and metal wires are coupled to ground bus to generate logic zero data. One type of memory may be built in one module layer. Memory type may be mixed in one module layer. The memory can be stacked in many module layers to provide vertically spaced memory integration. Each memory module layer can control identical portions of logic in the first module layer. Global control signals can select which module layer is coupled to the logic layer, and switch from one to another when needed. One interconnect structure couples intra and extra module connections. A multi-chip structure is thus made with only multiple memory layers at a very low added cost.

In a second aspect, a programmable storage unit in an integrated circuit that generates an output coupled to a high impedance device, said storage unit comprising: a first select device coupled to said output; and a first configuration memory circuit coupled to said first select device; and a first control signal coupled to said first select device to selectively couple or decouple said first configuration memory circuit from said output; and a second select device coupled to said output; and a second configuration memory circuit coupled to said second select device; and a second control signal coupled to said second select device to selectively couple or decouple said second configuration memory circuit from said output; wherein, the high impedance device is located in a first module layer, the first configuration memory circuit is located in a second module layer positioned above said first module layer, and the second configuration memory circuit is located in a third module layer positioned above said second module layer; and wherein, the output value can be switched between the first and second configuration memory bits instantly by activating said first or second control signal respectively.

In a third aspect, an alterable application specific integrated circuit (ASIC) that can instantly switch between N independently stored logic applications, wherein N is an integer value greater than one, the ASIC comprising: a plurality of programmable N-bit storage units, each unit generating a single output that couples to a high impedance device, each storage unit comprised of:

a first storage state comprising: a first select device coupled to said output; and a first configuration memory circuit coupled to said first select device; and a first control signal coupled to said first select device to selectively couple or decouple said first configuration memory circuit from said output; and a second storage state comprising: a second select device coupled to said output; and a second configuration memory circuit coupled to said second select device; and a second control signal coupled to said second select device to selectively couple or decouple said second configuration memory circuit from said output; and additional (N−3) similar storage states; and an $N^{th}$ storage state comprising: an $N^{th}$ select device coupled to said output; and an $N^{th}$ configuration memory circuit coupled to said $N^{th}$ select device; and an $N^{th}$ control signal coupled to said $N^{th}$ select device to selectively couple or decouple said $N^{th}$ configuration memory circuit from said output; and a first global control signal, said signal comprised of coupling together the first control signal of every storage unit in the first storage state; and a second global control signal, said signal comprised of coupling together the second control signal of every storage unit in the second storage state; and additional (N−3) similar global control signals; and an $N^{th}$ global control signal, said signal comprised of coupling together the $N^{th}$ control signal of every storage unit in the $N^{th}$ storage state;

wherein, the plurality of high impedance devices are located in a first module layer, the plurality of first configuration memory circuits are located in a second module layer positioned above said first module layer, and the plurality of second configuration memory circuits are located in a third module layer positioned above said second module layer, and so forth sequential positioning for additional (N−3) module layers, and the plurality of $N^{th}$ configuration memory circuits are located in an $N^{th}$ module layer positioned above the (N−1) module layer; and wherein, activating one of said first thru $N^{th}$ global control signals enables instant switching between the N stored logic applications.

Implementations of the above aspects may include one or more of the following. A plurality of ASICs may be fabricated in one smaller ASIC foot-print. One FPGA and a plurality of ASICs may be fabricated in one smaller ASIC foot-print. The logic layer is common to all ASICs and the metal structure is common to all ASICs. That provides a cost reduction per ASIC in the stacked die. Only configuration circuits are added for each application to the base die. RAM configuration circuits are user configurable. The user gets an emulation device with the RAM module to test and tweak and debug designs in an off-the-shelf silicon device. The user gets a safety valve to reduce his risk against unforeseen design changes or future design evolutions. ROM configuration circuits are very inexpensive, requiring only one metal custom mask. A plurality of ASICs can be stacked by stacking only the four metal ROM layers. One RAM module and a plurality of ROM modules may be stacked to build a programmable platform on a pre-defined ASIC base for insurance towards evolving design systems. Functionality and timing of the die is unchanged by the configuration module position chosen to program the IC. The ROM bit pattern is identical to a RAM bit pattern for the same functionality and timing. The ROM bit-pattern may be generated by first testing the design in a RAM platform. A plurality of ROM patterns may be finalized by testing those in a single RAM platform prior to customization. The RAM based IC product is re-programmable. The alterable ASIC has a remarkable low cost. A metal layer costs 3–4% extra. Four metal layers may cost 15% extra. Four ASICs stacked in one alterable ASIC with four ROM layers will only cost 15% more. One ASIC cost the stack is reduced 70% to 0.3× of equivalent 4 independent ASICs. An alterable ASIC only needs one package—reducing assembly cost. The stacked ASIC needs only one foot-print in the PC board and less board level wires to connect—reducing PC board costs. One FPGA and a plurality of ASICs may be incorporated into one die to dissever the FPGA with the ASIC costs. Furthermore, one large design may be broken into 4 or more small designs and implemented in the alterable ASIC with ROM layers to reduce the die cost Implementations of these aspects may further include one or more of the following. An FPGA has the first module logic block structure of an Array-ASIC. The programmable layers are removed from the Array ASIC to reduce the die size. Smaller die size reduce cost and reduce wire lengths which in turn improves performance. The Array-ASIC is configured by RAM or ROM circuits identically. The RAM and ROM layers are static circuits with no switching signals. RAM & ROM static power is limited to very small leakage currents. There is no dynamic power consumption in the extra RAM or ROM layers. The RAM does not need to have high performance transistors. Only logic zero and logic one states are needed for the RAM. Existing manufacturing techniques may be used to fabricate this stacked die. Only a logic process is needed for the ROM layered die, while a TFT process module inserted to a logic process may be used to fabricate RAM and ROM stacked die. Other memory modules may be inserted to a logic process to produce a different RAM element. The cost of software tools may be greatly reduced to implement these logic designs. Only one software partition, place and route tool is required to map synthesized logic to the device for both RAM and ROM patterns. An FPGA design flow for ASIC designs provide savings in time to solution (TTS), non recurring engineering costs (NRE) and upfront Tools costs. A RAM pattern may be instantly mapped to a custom metal-mask ROM pattern by a software tool with no human errors.

An advantage of the alterable ASIC is to provide a significant cost reduction for designs that can switch between fully optimized multiple design or partitioned design applications.

BRIEF DESCRIPTION OF THE DRAWINGS

FIG. 19A shows a first embodiment of a logic element for a 2-application alterable ASIC FIG. 19B/C shows two configurable high impedance devices in a programmable logic element FIG. 19D shows a second embodiment of a logic element for a 2-application alterable ASIC FIG. 20 shows a 2-application embodiment of an alterable ASIC

DESCRIPTION

Figure 1:
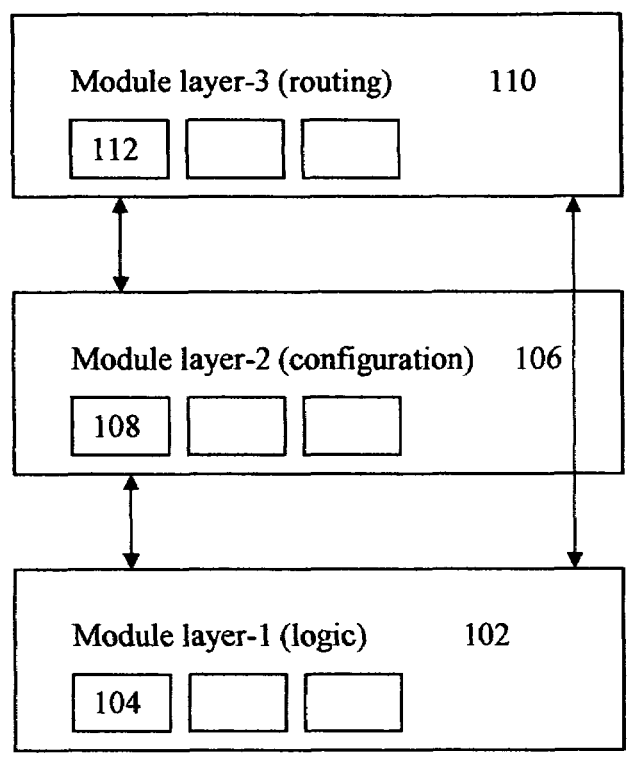
FIG. 1 shows a cross sectional view of a first embodiment of an integrated circuit.

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, SOI material as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense.

The term module layer includes a structure that is fabricated using a series of predetermined process steps. The boundary of the structure is defined by a first step, one or more intermediate steps, and a final step. The resulting structure is formed on a substrate.

The term configuration circuit includes one or more configurable elements and connections that can be programmed for controlling one or more circuit blocks in accordance with a predetermined user-desired functionality. In one embodiment, the configuration circuits include a plurality of memory circuits to store instructions to configure an FPGA. In another embodiment, the configuration circuits include a first selectable configuration where a plurality of RAM circuits is formed to store instructions to control one or more circuit blocks. The configuration circuits include a second selectable configuration with a predetermined conductive ROM pattern formed in lieu of the RAM circuit to control substantially the same circuit blocks. The memory circuit includes elements such as diode, transistor, resistor, capacitor, metal link, among others. The memory circuit also includes thin film elements. In yet another embodiment, the configuration circuits include a predetermined conductive pattern, via, resistor, capacitor or other suitable circuits formed in lieu of the memory circuit to control substantially the same circuit blocks.

The term "horizontal" as used in this application is defined as a plane parallel to the conventional plane or surface of a wafer or substrate, regardless of the orientation of the wafer or substrate. The term "vertical" refers to a direction perpendicular to the horizontal direction as defined above. Prepositions, such as "on", "side", "higher", "lower", "over" and "under" are defined with respect to the conventional plane or surface being on the top surface of the wafer or substrate, regardless of the orientation of the wafer or substrate.

FIG. 1 shows a cross sectional view of a first embodiment of an integrated circuit that can be selectably fabricated as either an FPGA or an ASIC. In this embodiment, a three-dimensional semiconductor device 100 is shown. The device 100 includes a first module layer 102 having a plurality of circuit blocks 104 embedded therein. The device 100 also includes a second module layer 106 formed substantially above the first module layer 102. One or more configuration circuits 108 are formed to store instructions to control a portion of the circuit blocks 104. In the embodiment of FIG. 1, wiring/routing circuits 112 are formed on a third layer 110 above the second layer 106. Circuits 112 connect to both circuits 104 and 108 to complete the functionality of the PLD.

Figure 2:
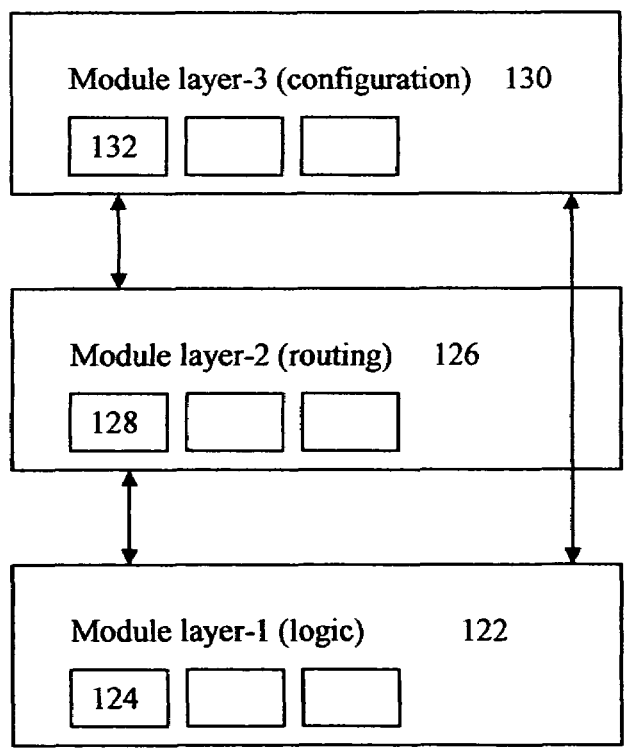
FIG. 2 shows a cross sectional view of a second embodiment of an integrated circuit.

FIG. 2 shows a cross sectional view of a second embodiment of an integrated circuit that can be selectably fabricated as either an FPGA or an ASIC. In this embodiment, a three-dimensional semiconductor device 120 is shown. The device 120 includes a first module layer 122 having a plurality of circuit blocks 124 embedded therein. The device 120 also includes a second module layer 126 formed substantially above the first module layer 122 that includes wiring and/or routing circuitry 128, and a third module layer 130 formed substantially above the second module layer 126 that includes configuration circuits 132. The wiring/routing circuitry 128 is electrically connected to the circuit blocks 124 and to configuration circuits 132 in the third module layer 130. The configuration circuits 132 store instructions to control a portion of the circuit blocks 124.

Figure 3:
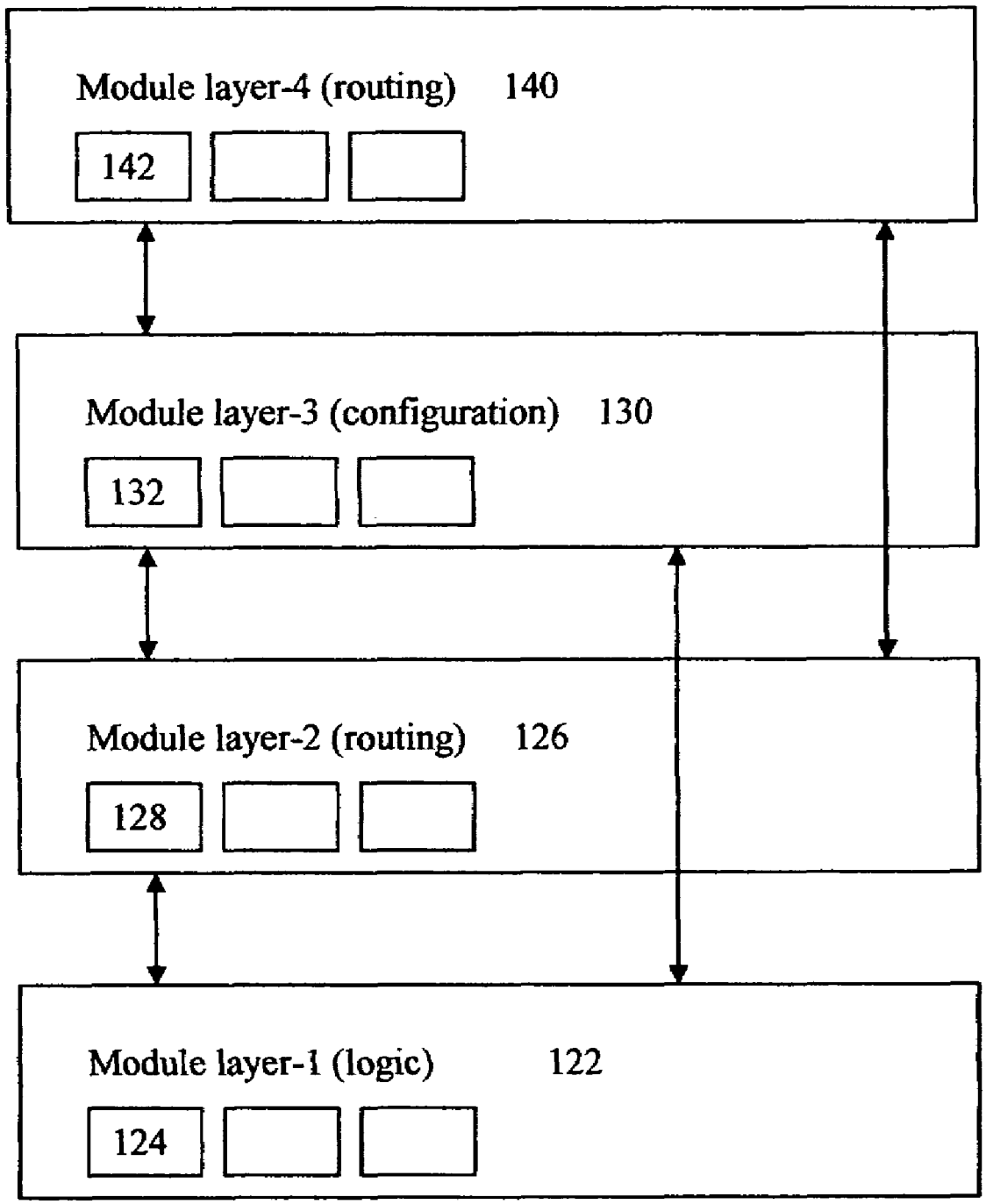
FIG. 3 shows a cross sectional view of a third embodiment of an integrated circuit.

FIG. 3 shows a third embodiment which is substantially similar to the embodiment of FIG. 2. In the embodiment of FIG. 3, a fourth layer 140 having wiring/routing circuitry 142 is position above the third layer 130. The wiring/routing circuitry 142 is electrically connected to one of the following: one or more circuit blocks 124, one or more wiring/routing circuitry 128, and one or more configuration circuits 132.

Figure 4:
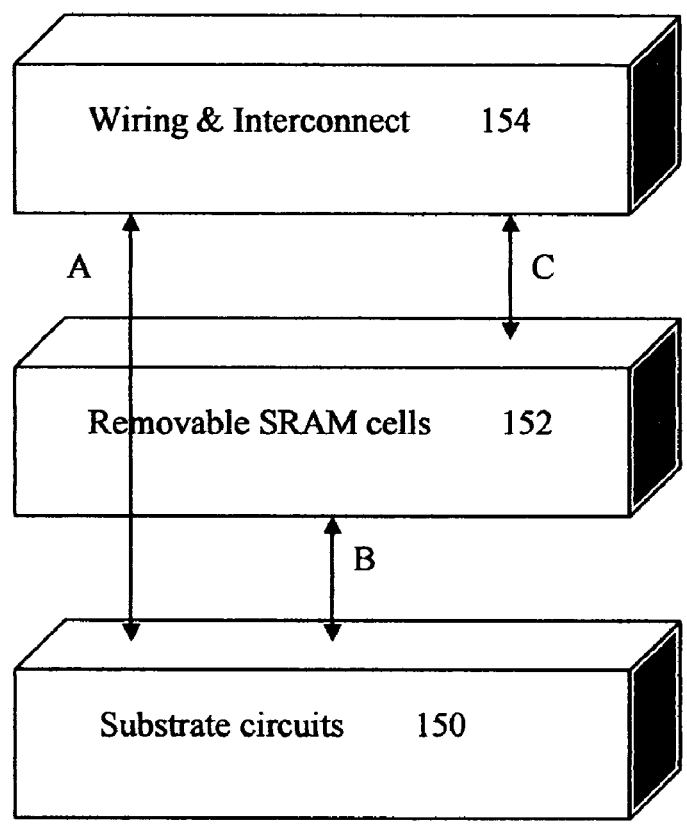
FIG. 4 shows a cross sectional view of a fourth embodiment of an integrated circuit.

FIG. 4 shows one implementation where the configuration memory element is SRAM First, silicon transistors 150 are deposited on a substrate. A module layer of removable SRAM memory cells 152 are positioned above the silicon transistors 150, and a module layer of interconnect wiring or routing circuit 154 is formed above the removable memory cells 152. To allow this replacement, the design adheres to a hierarchical layout structure. As shown in FIG. 4, the SRAM cell module is sandwiched between the single crystal device layers below and the metal layers above electrically connecting to both. It also provides through connections "A" for the lower device layers to upper metal layers. The SRAM module contains no switching electrical signal routing inside the module. All such routing is in the layers above and below. Most of the programmable element configuration signals run inside the module. Upper layer connections to SRAM module "C" are minimized to Power, Ground and high drive data wires. Connections "B" between SRAM module and single crystal module only contain logic level signals and replaced later by Vcc and Vss wires. Most of the replaceable programmable elements and its configuration wiring is in the "replaceable module" while all the devices and wiring for the end ASIC is outside the "replaceable module". In other embodiments, the replaceable module could exist between two metal layers or as the topmost layer satisfying the same device and routing constraints.

Figure 18:
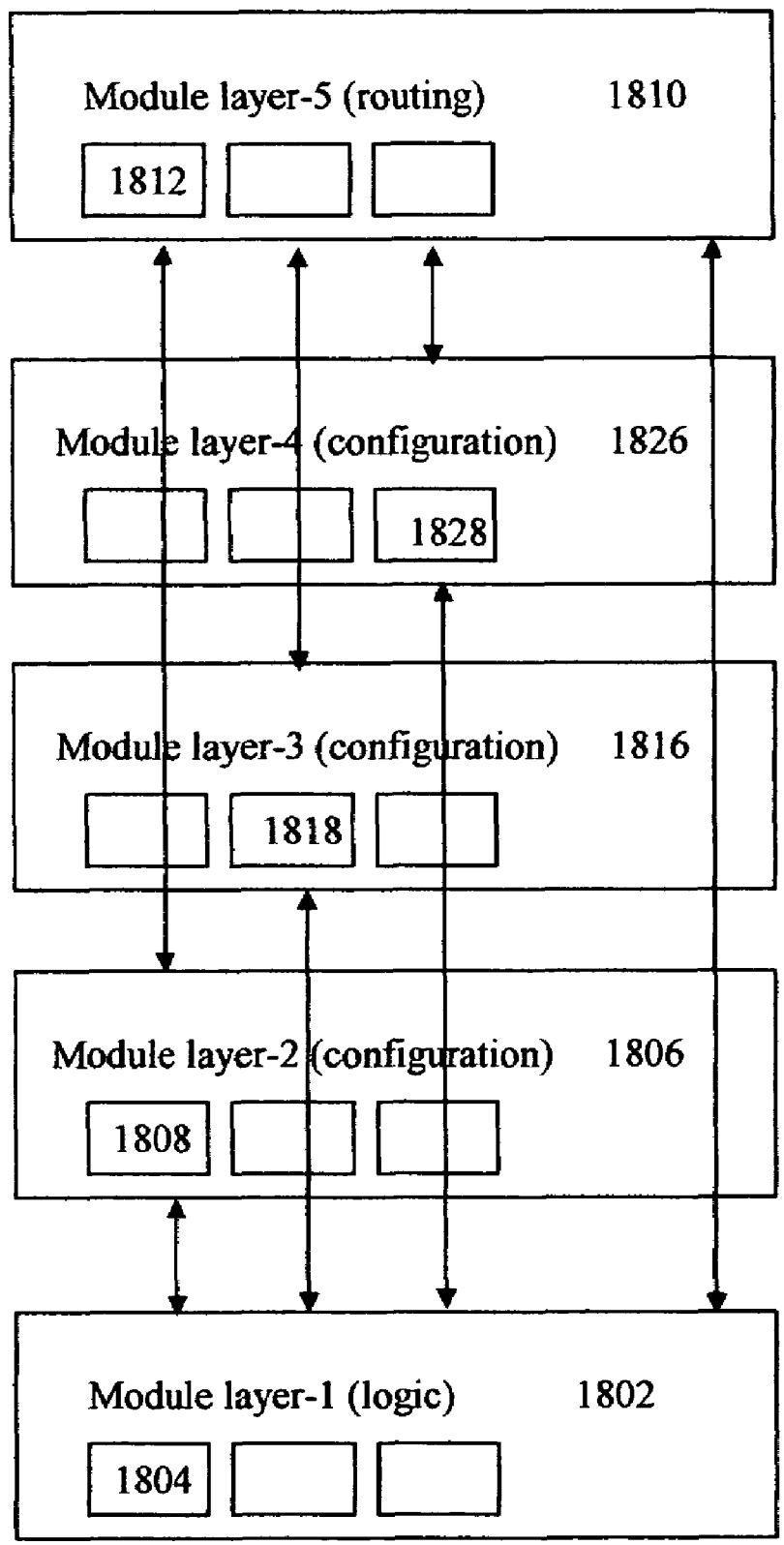
FIG. 18 shows a 3-application Alterable ASIC comprising 3 configuration module layers

FIG. 18 shows a first embodiment of an N-application alterable ASIC. This integrated circuit that can be fabricated as either an FPGA or an ASIC or both. In this embodiment, a three-dimensional semiconductor device 1800 is shown. The device 1800 includes a first module layer 1802 having a plurality of circuit blocks 1804 embedded therein. This circuit blocks comprises high impedance configurable logic devices that are customized by configuration memory data. The device 1800 also includes a second module layer 1806 formed substantially above the first module layer 1802. A first set of one or more configuration circuits 1808 are formed to store instructions to control a portion of the circuit blocks 1804. The device 1800 also includes a third module layer 1816 formed substantially above the first module layer 1802. A second set of one or more configuration circuits 1818 are formed to store instructions to control the same portion of the circuit blocks 1804. The device 1800 also includes a fourth module layer 1826 formed substantially above the first module layer 1802. A third set of one or more configuration circuits 1828 are formed to store instructions to control the same portion of the circuit blocks 1804. In the embodiment in FIG. 18, wiring/routing circuits 1812 are formed on a fifth module layer 1810 above the fourth module layer 1826. Circuits 1812 connect to circuits 1804, 1808, 1818 and 1828 to complete the functionality of the alterable ASIC. In a first embodiment, the configuration circuits may be random access memory (RAM) circuits providing user configurability. In a second embodiment these circuits may be mask configurable read only memory (ROM) hard-wire circuits. In a third embodiment, one configuration module layer may hold RAM circuits, while another configuration module may hold ROM circuits. Control logic circuits in module layer 1 will allow the user to select which configuration module controls the logic circuits located in module layer 1. Each module layer will hold an optimized memory bit pattern for a specific system design application. Thus switching the configuration module will allow a user to switch applications in the same base die. The incremental cost for each application is the cost of an additional configuration module layer. For an extra configuration ROM module layer, this cost is only an extra metal mask cost, a very small incremental cost to the first ASIC.

Fabrication of the IC also follows a modularized device formation. Formation of transistors 150 and routing 154 is by utilizing a standard logic process flow used in the ASIC fabrication. Extra processing steps used for memory element 152 formation are inserted into the logic flow after circuit layer 150 is constructed. A full disclosure of the vertical integration of the TFT module using extra masks and extra processing is in the co-pending incorporated by reference applications discussed above.

During the customization, the base die and the data in those remaining mask layers do not change making the logistics associated with chip manufacture simple. Removal of the SRAM module provides a low cost standard logic process for the final ASIC construction with the added benefit of a smaller die size. The design timing is unaffected by this migration as lateral metal routing and silicon transistors are untouched. Software verification and the original FPGA design methodology provide a guaranteed final ASIC solution to the user. A full disclosure of the ASIC migration from the original FPGA is in the co-pending incorporated by reference applications discussed above.

In FIG. 4, the third module layer is formed substantially above the first and second module layers, wherein interconnect and routing signals are formed to connect the circuit blocks within the first and second module layers. Alternatively, the third module layer can be formed substantially below the first and second module layer with interconnect and routing signals formed to connect the circuit blocks within the first and second module layers. Alternatively, the third and fourth module layers positioned above and below the second module layer respectively, wherein the third and fourth module layers provide interconnect and routing signals to connect the circuit blocks within the first and second module layers. Similarly, other embodiments of alterable ASIC shown in FIG. 18 may also have the fifth module layer 1810 positioned just above the first module layer 1802, or in one of many other possibilities.

In yet another embodiment of a programmable multi-dimensional semiconductor device, a first module layer is fabricated having a plurality of circuit blocks formed on a first plane. The programmable multi-dimensional semiconductor device also includes a second module layer formed on a second plane. A plurality of configuration circuits is then formed to store instructions to control a portion of the circuit blocks.

Next, details of the circuit blocks 104, the configuration circuit 108, and the wiring and/or routing circuit 112 in FIG. 1 are detailed.

Figure 5:
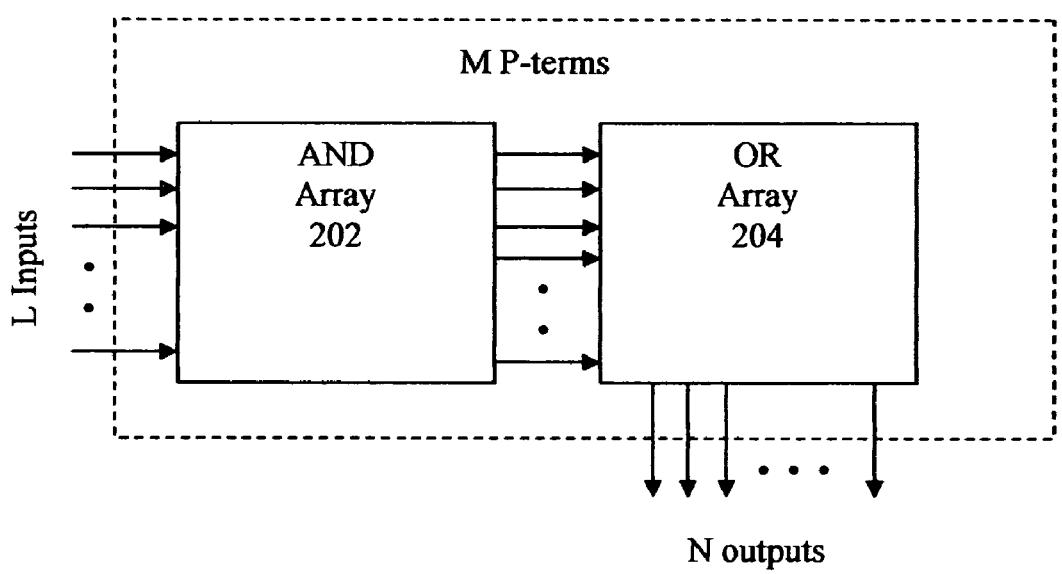
FIG. 5 shows an exemplary AND-OR PLD Architecture.
Figure 6:
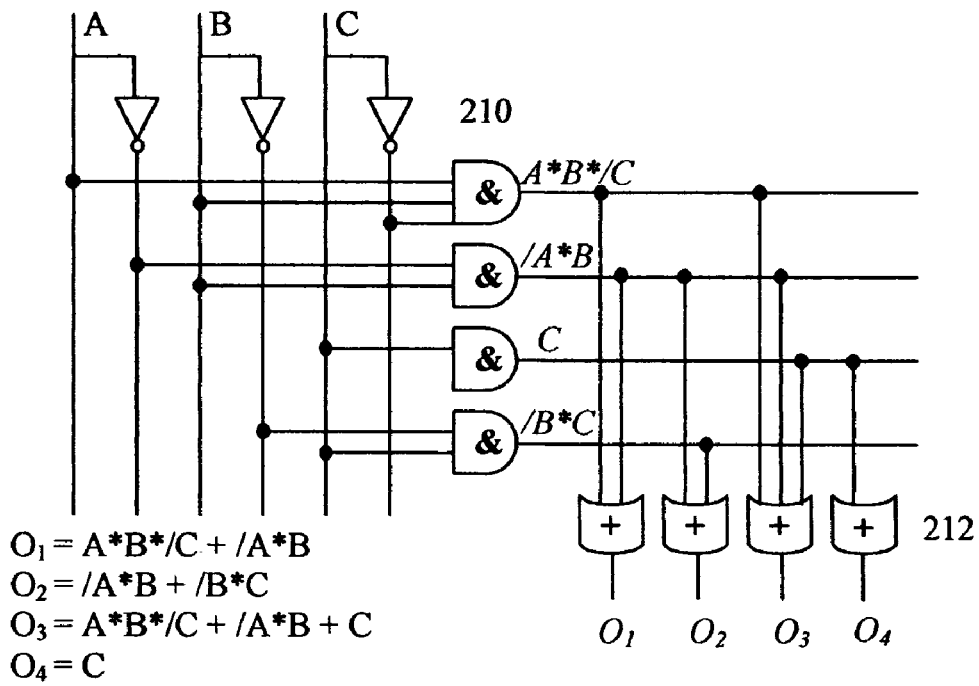
FIG. 6 shows an exemplary AND-OR array gate realization of PLD.

A variety of digital or analog circuits can be used in circuit blocks 104. These circuit blocks include programmable logic blocks to allow user customization of logic. In one embodiment, programmable logic blocks are provided to respond to input data signals. The programmable logic blocks develop corresponding complete or partial output logic signals. Registers are used to store the output logic signals and either outputting them to output terminals or returning them as inputs to additional programmable logic blocks. The registers themselves can be programmable, allowing those to be configured such as T flip-flops, JK flip-flops, or any other register. The logic blocks may contain no registers, or the registers may be programmed to be by-passed to facilitate combinational logic implementation. The programmable logic block can be selected from one of a pass gate logic, a multiplexer logic, a truth table logic, or an AND/OR logic. FIG. 5 shows an exemplary AND-OR PLD Architecture. AND and OR arrays 202 and 204 contain user configurable programmable elements. FIG. 6 shows an exemplary AND-OR array gate realization of a three input, four P-term, four output PLD. The AND and OR array 210–212 are shown programmed to a specific pattern.

Figure 7:
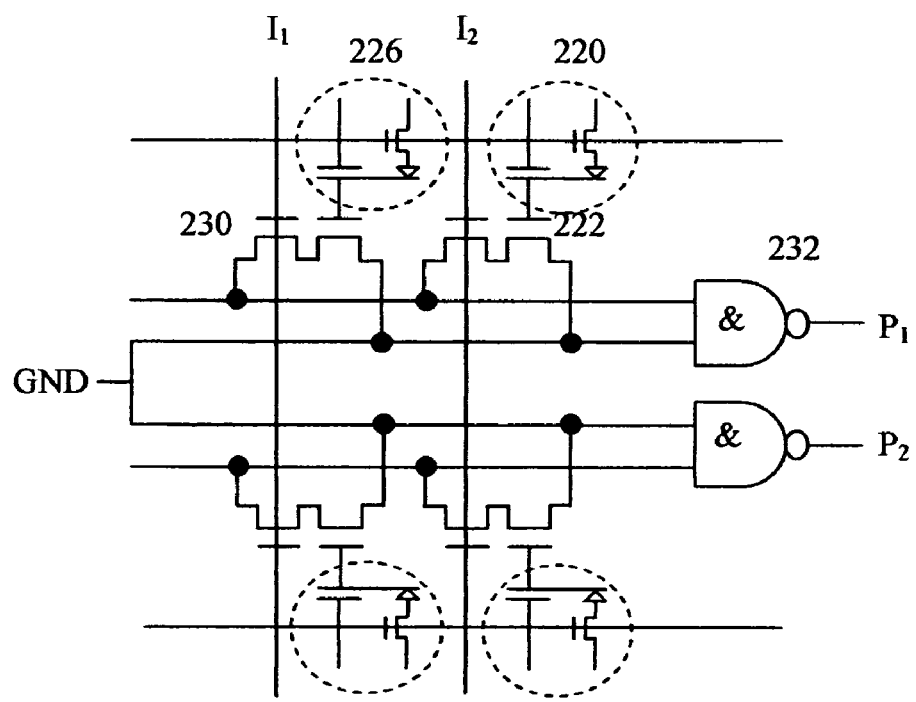
FIG. 7 shows one EEPROM implementation of a P-Term logic array.
Figure 8:
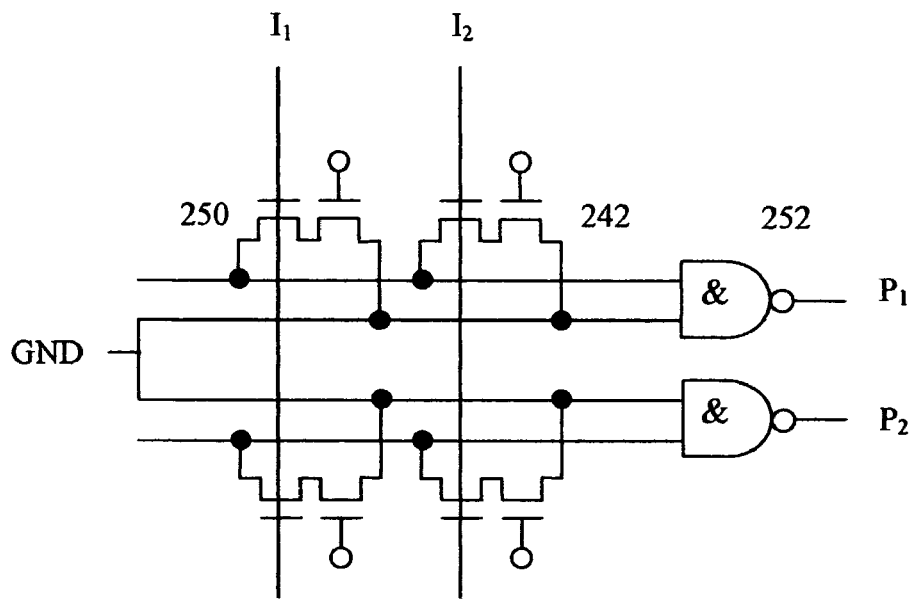
FIG. 8 shows P-term configuration for SRAM/hard-wired PLD architecture.

In yet other embodiments, the circuit block 104 contains a RAM/ROM logic block consisting of "logic element tree" or "P-Term logic array" blocks that perform logic functions. FIG. 7 shows one such NAND EEPROM implementation of a P-Term in NAND-NOR logic array, while FIG. 8 shows the same P-term configuration for either SRAM, or hard-wired PLD architectures. FIG. 7 shows two mirrored outputs P1 and P2. For output P1, an AND gate 232 receives signals from pass transistors 222, 224, 228 and 230. The pass transistor 222 is controlled by block 220 shown in the dashed circle, while the pass transistor 228 is controlled by block 226 shown inside the dashed circle. Similarly, the upper half of FIG. 8 includes an AND gate 252 that receives inputs from pass transistors 242, 244, 248 and 250, respectively.

Figure 9:
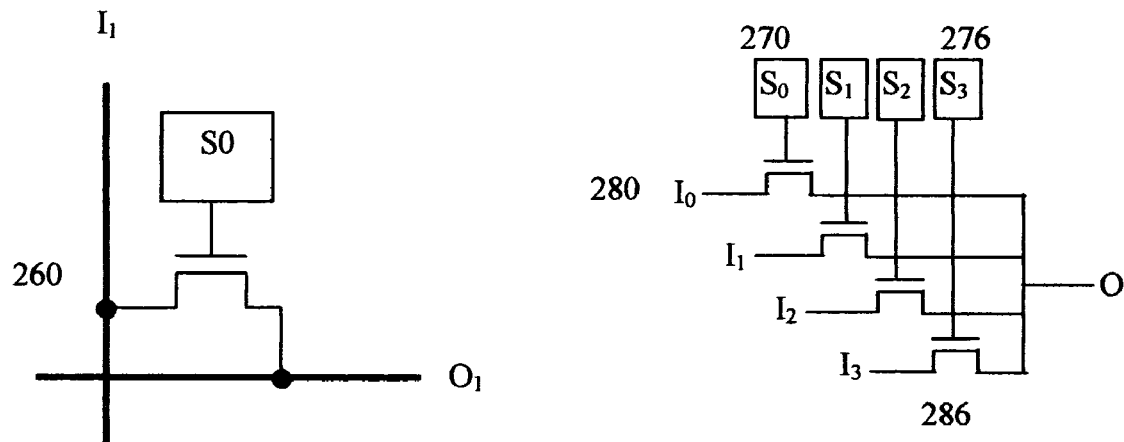
FIG. 9 shows exemplary pass-gate logic.
Figure 10:
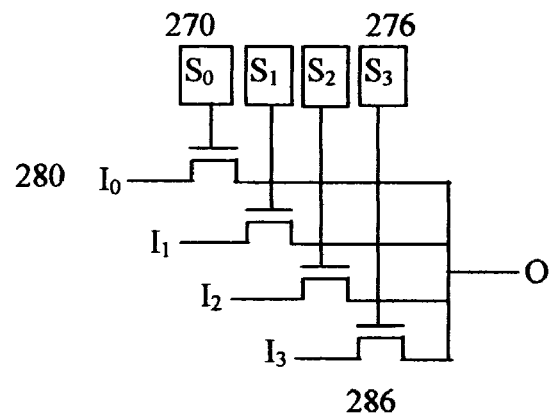
FIG. 10 shows an exemplary 4-Input logic MUX

FIG. 9 shows exemplary pass-gate logic 260 connecting one input to one output. The NMOS pass gate voltage level S0 determines an ON and OFF connection. FIG. 10 shows an exemplary 4-Input logic MUX implementing an output function O where O=I0*S0+I1*S1+I2*S2+I3*S3. In the MUX, only one of S0 270, S1 272, S2 274, and S3 276 has a logic one. The MUX is constructed by combining four NMOS pass gate logic elements 280–286 shown in FIG. 9.

Figure 11:
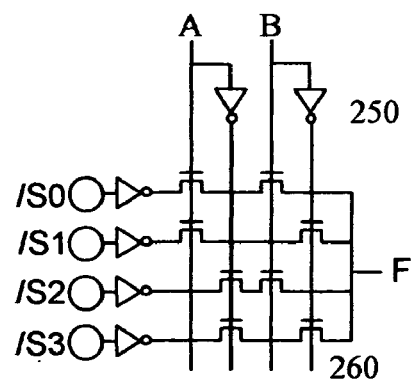
FIG. 11 shows an exemplary 2-Input Truth Table.

FIG. 11 shows an exemplary 2-input truth table logic realization of an output function F where, $$F=/A*/B*S0+/A*B*S1+A*/B*S2+A*B*S3 (/A \text{ means not } A).$$

The truth table logic values are represented by S0, S1, S2 and S3. The realization is done through six inverters collectively designated 250 and eight pass transistors collectively designated 260. Logic values are stored in 4 programmable registers.

Figure 12:
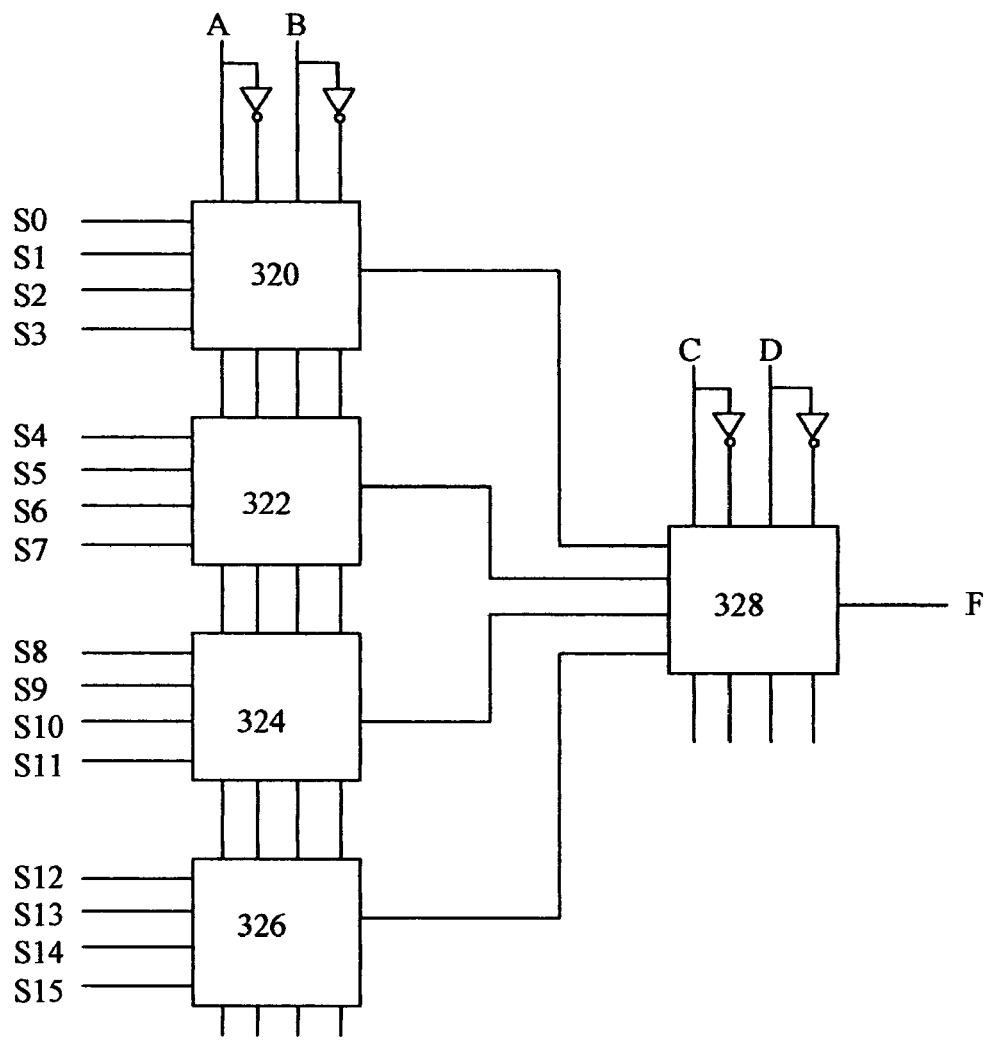
FIG. 12 shows a logic tree implementation of a 4-Input Truth Table.

FIG. 12 shows a logic tree constructed with five 2-input truth table logic blocks 320–328 to perform a full four input truth table. A four input truth table has 16 possible logic values S0, S1 , . . . , S15. As the number of inputs grow to N, this logic tree construction requires $2^N$ logic values, and $2^{(N-1)}$ branches in the logic tree. For large N values, a full truth table realization is less efficient compared to a partial product term AND-OR array realization.

In another embodiment, the programmable logic block can be a programmable microprocessor block. The microprocessor can be selected from third party IP cores such as: 8051, Z80, 68000, MIPS, ARM, and PowerPC. These microprocessor architectures include superscalar, Fine Grain Multi-Threading (FGMT) and Simultaneous Multi-Threading (SMT) that support Application Specific Packet Processing (ASPP) routines. To handle Programmable Network Interface (PNI) the processor can contain hardware and software configurability. Hardware upgradeability can be greatly enhanced in microprocessors embedded in PLD's by making use of the available logic content of the PLD device. Programmable features can include varying processor speed, cache memory system and processor configuration, enhancing the degree of Instruction Level Parallelism (ILP), enhancing Thread level parallelism (TLP). Such enhancements allow the user to optimize the core processor to their specific application. Cache parameters such as access latency, memory bandwidth, interleaving and partitioning are also programmable to further optimize processor performance and minimize cache hit miss rates. Additionally, the processor block can be a Very Long Instruction Word (VLIW) processor to handle multimedia applications. The processor block can include a cache controller to implement a large capacity cache as compared with an internal cache.

While a PLD can be configured to do DSP functions, the programmable logic block can also contain a digital signal processor (DSP), which is a special purpose processor designed to optimize performance for very high speed digital signal processing encountered in wireless and fiber-optic networks. The DSP applications can include programmable content for cache partitioning, digital filters, image processing and speech recognition blocks. These real-time DSP applications contain high interrupt rates and intensive numeric computations best handled by hardware blocks. In addition, the applications tend to be intensive in memory access operations, which may require the input and output of large quantities of data. The DSP cache memory may be configured to have a "Harvard" architecture with separate, independent program and data memories so that the two memories may be accessed simultaneously. This architecture permits an instruction and an operand to be fetched from memory in a single clock cycle. A modified Harvard architecture utilizes the program memory for storing both instructions and operands to achieve full memory utilization. The program and data memories are often interconnected with the core processor by separate program and data buses. When both instructions and operands (data) are stored in a single program memory, conflicts may arise in fetching data with the next instruction. Such conflicts have been resolved in prior art for DSP's by providing an instruction cache to store conflicting instructions for subsequent program execution.

In yet another embodiment, programmable logic block can contain software programmability. These software functions are executed in DSP, ARM, or MIPS type inserted IP cores, or an external host CPU. Accelerators connected by a configurable SRAM switching matrix enhance the computation power of the processors. The microprocessor has local permanent SRAM memory to swap, read, and write data. The switch matrix is pre-designed to offer both hard-wire and programmable options in the final ASIC. In this situation, the circuit block 104 can be a functional block that performs well-defined, commonly-needed function, such as special D/A or A/D converter, standard bus interface, or such block that implements special algorithms such as MPEG decode. The special algorithms implemented can be hardware versions of software. For example, algorithms relating to digital radio or cellular telephone such as WCDMA signal processing can be implemented by the functional block. Other functional blocks include PCI, mini-PCI, USB, UART blocks that can be configured by specifying the SRAM logic blocks.

In yet another embodiment, the circuit block 104 can be memory such as a register file, cache memory, static memory, or dynamic memory. A register file is an array of latches that operate at high speed. This register length counter may be programmable by the user. A cache memory has a high access throughput, short access latency and a smaller capacity as compared with main memory. The cache memory may be programmable to partition between the different requirements of the system design. One such need is the division between L1 and L2 cache requirements for networking applications. The memory can also be static random access memory or (SRAM) device with an array of single port, or multi-port addressable memory cells. Each cell includes a four transistor flip-flop and access transistors that are coupled to input/output nodes of the flip-flop. Data is written to the memory cell by applying a high or low logic level to one of the input/output nodes of the flip-flop through one of the access transistors. When the logic level is removed from the access transistor, the flip-flop retains this logic level at the input/output node. Data is read out from the flip-flop by turning on the access transistor. The memory can also be dynamic random access memory (DRAM). Generally, a DRAM cell consists of one transistor and a capacitor. A word line turns on/off the transistor at the time of reading/writing data stored in the capacitor, and the bit line is a data input/output path. DRAM-data is destroyed during read, and refresh circuitry is used to continually refresh the data. Due to the low component count per bit, a high density memory device is achieved.

In another embodiment, the circuit block 104 can be an intellectual property ("IP") core which is reusable for licensing from other companies or which is taken from the same previous design. In core-based design, individual cores may be developed and verified independently as stand-alone modules, particularly when IP core is licensed from external design source. These functions are provided to the user as IP blocks as special hardware blocks or pre-configured programmable logic blocks. The IP blocks connect via a programmable switching matrix to each other and other programmable logic. The hardware logic block insertion to any position in a logic sequence is done through the configurable logic matrix. These hardware logic blocks offer a significant gate count reduction on high gate count frequently used logic functions, and the user does not require generic "logic element" customization. In both cases, the user saves simulation time, minimize logic gate count, improve performance, reduce power consumption and reduce product cost with pre-defined IP blocks. The switch matrix is replaced by hard-wires in the final ASIC.

The circuit blocks 104 can also be an array of programmable analog blocks. In one embodiment, the analog blocks include programmable PLL, DLL, ADC and DAC. In another embodiment, each block contains an operational amplifier, multiple programmable capacitors, and switching arrangements for connecting the capacitors in such as a way as to perform the desired function. Switched capacitor filters can also be used to achieve an accurate filter specification through a ratio of capacitors and an accurate control of the frequency of a sampling clock. Multiple PLL's can be programmed to run at different frequencies on the same chip to facilitate SoC applications requiring more than one clock frequency.

The circuit blocks 104 also contain data fetch and data write circuitry required to configure the configuration circuits 108. This operation may be executed by a host CPU residing in the system, or the PLD device itself. During power up, these circuits initialize and read the configuration data from an outside source, either in serial mode or in parallel mode. The data is stored in a predefined word length locally and written to the configurability allocation. The programmed configuration data is verified against the locally stored data and a programming error flag is generated if there is a mismatch. These circuits are redundant in the conversion of the PLD to an ASIC. However, these circuits are used in both FPGA and ASIC for test purposes, and has no cost penalty. A pin-out option has a "disable" feature to disconnect them for the customer use in the FPGA and ASIC.

Configuration circuits 108 provide active circuit control over digital circuits 104. One embodiment of the configuration circuit includes an array of memory elements. The user configuration of this memory amounts to a specific bitmap of the programmable memory in a software representation.

Suitable memory elements include volatile or non volatile memory elements. In non-volatile memory (NVM) based products, configurable data is held in one of metal link fuse, anti-fuse, EPROM, Flash, EEPROM memory element, or ferro-electric elements. The first two are one time programmable (OTP), while the last four can be programmed multiple times. As EPROM's require UV light to erase data, only Flash & EEPROM's lend to in-system programmability (ISP). In volatile products, the configurable data storage can be SRAM cells or DRAM cells. With DRAM cells, the data requires constant refresh to prevent losses from leakages. Additionally, one or more redundant memory cells controlling the same circuit block can be used to enhance device yield.

The components of the memory element array can be a resistor, capacitor, transistor or a diode. In another embodiment of the configuration circuit, a memory element can be formed using thin film deposition. The memory element can be a thin film resistor, thin film capacitor, thin film transistor (TFT) or a thin film diode or a group of thin film devices connected to form an SRAM cell.

This discussion is mostly on SRAM elements and can easily extend to include all other programmable elements. In all cases, the design needs to adhere to rules that allow programmable module elimination, with no changes to the base die, a concept not used in PLD, FPGA, Gate Array and ASIC products today.

Figure 13:
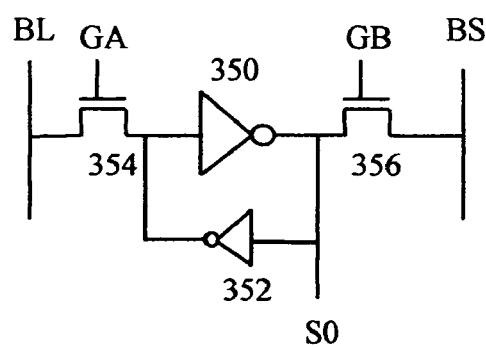
FIG. 13 shows an exemplary 6T SRAM.

An exemplary 6T SRAM cell, shown in FIG. 13, needs no high voltage capability, nor added process complexity. The cell of FIG. 13 has two back-to-back inverters 350–352 whose access is controlled by pass transistors 354–356. In addition, R-load & Thin Film Transistor (TFT) load PMOS based SRAM cells can be used for PLDs and FPGAs. To achieve zero stand-by power by eliminating sensing circuitry, and reduce memory element count for low input functions, these SRAM cells are embedded in truth table logic (also called Look-Up-Table) based architectures.

Figure 14:
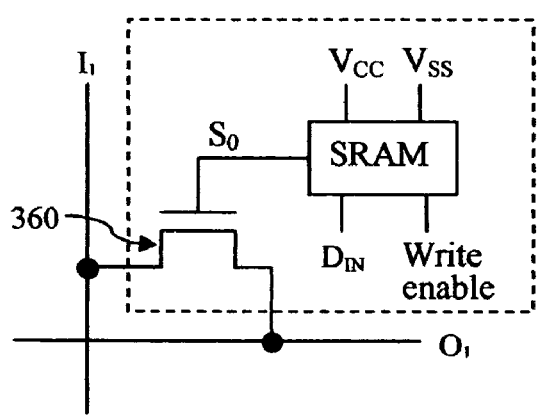
FIG. 14 shows pass gate transistor logic controlled by SRAM.
Figure 15:
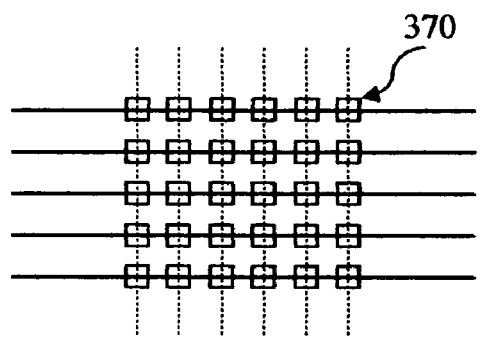
FIG. 15 shows one embodiment of a 5×6 switch matrix.
Figure 16:
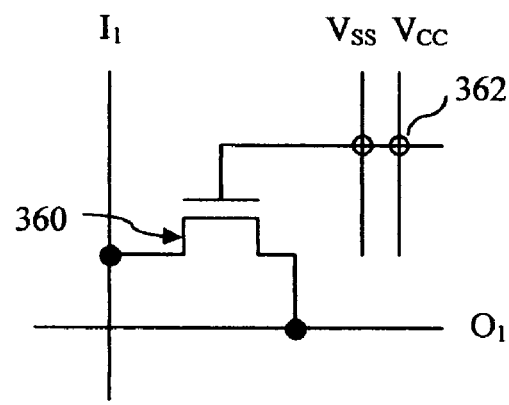
FIG. 16 shows pass gate controlled by Vcc (power) or Vss (ground)

Pass gate transistor 360 logic controlled by SRAM is shown in FIG. 14. In this embodiment, the memory cell (such as the cell of FIG. 13) drives the pass transistor 360 to affect an outcome. A 5×6-switch point matrix 370 controlled by 30-SRAM cells coupled to 30-NMOS pass gates is shown in FIG. 15. FIG. 16 shows the NMOS pass gate 360 logic controlled by the SRAM in FIG. 14 converted to hard-wire logic. A contact 362, connected to Vcc (logic 1) or Vss (logic 0) depending on the SRAM logic content, replace the SRAM cell. The SRAM logic mapping to hard wire connections are automatic and done by a software program that is verifiable against the bit-map.

Figure 17:
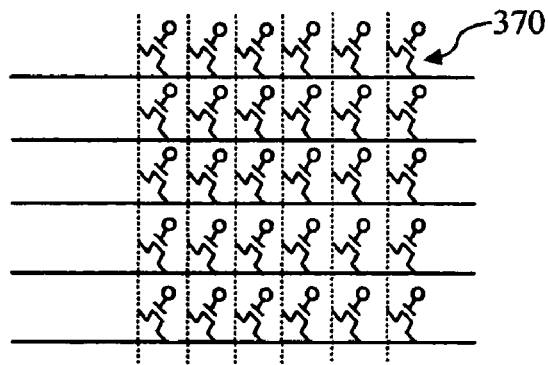
FIG. 17 shows the 5×6 switch matrix

Similarly, FIG. 17 shows the 5×6-switch point matrix 370 hard-wired by replacing the SRAM bits that control NMOS gates with hard-wires to Vcc or Vss. In FIG. 17, the bubble may represent either SRAM or hard-wire Vcc or Vss control on NMOS pass gates. In the case of Fuse or Antifuse arrays, contact or no contact between the two metal lines in FIG. 15 directly replaces the programmable element and there is no NMOS pass-gate needed The P-Term logic builds the core of PLD's and complex PLD's (CPLD's) that use AND-OR blocks 202–204 (or equivalent NAND-NOR type logic functions) as shown in the block diagram of FIG. 5 and one expansion is shown in FIG. 6 with AND gates 210 and OR gates 212. Gate implementation of two inputs (I1, I2) and two P-terms (P1, P2) NAND function can be single poly EEPROM bits as shown in FIG. 7. The dotted circle contains the charge trapping floating gate, the programming select transistor, tunneling diode, a control gate capacitor and programming access nodes. The SRAM cell replaces that entire circle in this invention as detailed next. The SRAM NAND-NOR array (also AND-OR array) replacement has not been realized in prior art as SRAM cells require Nwell & Pwell regions that consume large silicon area to prevent latch-up. The SRAM in TFT do not have well related constraints as NMOS and PMOS bodies are isolated from each other. Keeping the two pass gates in silicon layers and moving SRAM to TFT layers allow P-Term logic implementation with SRAM cells and subsequent replacement with hard-wires. In TFT SRAM conversion to final ASIC, the bubble on NMOS gate becomes a hard-wire connection to Vcc or Vss.

The length of input and output wires, and the drive on NMOS pass gates and logic gate delays determine the overall PLD delay timing, independent of the SRAM cell parameters. By moving SRAM cell to TFT upper layers, the chip X,Y dimensions are reduced over 20% to 50% compared to traditional SRAM FPGA's, providing a faster logic evaluation time. In addition, removal of SRAM cell later does not alter lateral wire length, wire loading and NMOS pass gate characteristic. The vertical dimension change in eliminating the memory module is negligible compared to the lateral dimension of the ASIC, and has no impact on timing. This allows maintaining identical timing between the FPGA and ASIC implementations with and without the SRAM cells. The final ASIC with smaller die size and no SRAM elements have superior reliability, similar to an ASIC, leading to lower board level burn-in and field failures compared to PLD's and FPGA's in use today.

FIG. 18 provides an extension of the discussion provided for FIG. 1 thru FIG. 17 to include a plurality of configuration module layers. The total number of configuration module layers may be two, three, four or as many as N, where N is an integer value greater than one. The volatile configuration SRAM data shown in module 152 of FIG. 4 has to be loaded when the device is powered. That takes a considerable amount of time as the non-volatile image of configuration data resides outside the chip, and chip to chip external data transfer bandwidth limitations and external micro processor loading can affect this operation. Once the device is powered up, to change an FPGA application new SRAM data has to be loaded to the device. That change requires fresh data to be reentered, or an intelligent algorithm to identify only the bits that change, and then make that change—all of which is time consuming to delay the application. However, if a plurality of configuration images are saved in RAM layers or ROM layers on chip in vertically stacked modules, applications can be switched on the fly from one to another by simply asserting global control signals to switch to the desired configuration module. Similarly partitionable designs can be implemented in part and stacked in RAM or ROM layer to reduce the overall chip cost and improve performance. Circuit blocks 1804 are similarly described as modules 104 in device 100 in FIG. 1. High impedance configurable devices programmed by the configuration memory data in modules 1806, 1816 or 1826 directly couple to configurable memory bits.

FIG. 19A shows a first embodiment of a 2-bit configurable logic element for a 2-application alterable ASIC. The configurable logic element comprises a high impedance device 1911 and a programmable storage unit comprising control signals 1920 & 1930, decoding select devices 1912 & 1913, and configuration memory circuits 1914 and 1915. Each configuration circuit 1914 and 1915 is similar to circuit 220 in FIG. 7, or the circuit in FIG. 13, or the SRAM device that generates $S_O$ output in FIG. 14, or Vss/Vcc mask ROM connection 362 shown in FIG. 16. It comprises a RAM element and access circuitry to change the RAM data or it is a simple ROM connection. Identical bit pattern in RAM or ROM layers provide identical functionality and timing in the alterable ASIC. This RAM or ROM bit pattern is obtained during the place and routing of a synthesized logic design using a software driven CAE tool. A RAM bit-pattern can be loaded into a pre-fabricated device and tweaked to either debug or improve the design. It is more economical for a ROM bit-pattern to be tested first in a RAM module, debugged, and then committed to a custom metal ROM mask. When control signal 1920 is activated, the configurable memory element in 1915 is coupled to the gate terminal of the high impedance device 1911. When control signal 1930 is activated, the configurable memory element in 1914 is coupled to the gate terminal of the high impedance device 1911. Only one memory bit is allowed to couple to said gate, thus device 1911 response can be switched between the configuration data stored in circuit 1914 and 1915. In the embodiment shown in FIG. 19A, devices 1911, 1912 and 1913 are located in a first module layer 1901. The first configuration circuit 1914 is located in module layer 1902 positioned above module 1901. The second configuration circuit 1915 is located in module layer 1903 positioned above module 1901, and further positioned above module layer 1902. Similarly, for an N-bit storage element, N such configuration circuit module layers may be stacked one on top of the other, all positioned above the first logic module layer 1901. Two high impedance devices used in FIG. 19A are shown in FIG. 19B and FIG. 19C respectively. In FIG. 19B, a pass-gate logic element similar to device 260 in FIG. 9 is shown. In FIG. 19C, an inverter logic element similar to the inverters shown in FIG. 11 is shown In both cases, an output signal $S_O$ from a configuration circuit sets the state of the logic element.

FIG. 19D shows a second embodiment of the 2-bit configurable logic element for the 2-application alterable ASIC. The only difference with FIG. 19D as compared to FIG. 19A is in the location of select devices 1912 and 1913—they are now located in modules 1902 and 1903 respectively. The advantage with this scheme is that only one vertical post is needed from high impedance device 1911 to couple configuration memory circuits 1914 or 1915. The disadvantage is in that module layers 1902 and 1903 must provide a pass-gate transistor such as 1912 and 1913 in that module. This is not a difficulty when the configuration circuit is a RAM module comprising thin film transistors. When the configuration circuit is a ROM module, there is no TFT layer needed for the ROM, and FIG. 19A is a more preferred construction option.

FIG. 20 illustrates a portion of a 2-application alterable ASIC, comprising three 2-bit configurable logic elements as discussed in FIG. 19. In FIG. 20, a global control signal 2020 is constructed by coupling each control signal for the plurality of select devices 2013 that access the plurality of configuration memory circuits 2015 in module layer 2003. A global control signal 2030 is constructed by coupling each control signal for the plurality of select devices 2012 that access the plurality of configuration memory circuits 2014 in module layer 2002. If there are more than two configurable module layers, a global control signal for each module layer is constructed in a similar fashion. Logic circuits and the plurality of programmable high impedance circuits 2011 are located in module layer 2001, and those circuits are fixed for a given integrated circuit. Global signal 2020 enables every programmable logic circuit 2011 to instantly couple to configuration memory bits in module 2003. Similarly, global signal 2030 enables every programmable logic circuit 2011 to instantly couple to configuration memory bits in module 2002. Thus, this alterable ASIC can switch between the application stored in the configuration memory bits in module 2002 and the configuration memory bits in module 2003. As discussed in FIG. 19D, a second embodiment may have select devices 2013 and 2012 located in modules 2003 and 2002 respectively, without departing from the main teachings in these three dimensional circuits.

Next, the wiring and/or routing circuit 112 in FIG. 1 is discussed. The wiring circuit 1812 in FIG. 18 is identical to circuit 112 and hence not discussed in specific terms. The wiring and/or routing circuit connects each logic block to each other logic block and provide some interconnection for configuration circuits. The wiring/routing circuit allows a high degree of routing flexibility per silicon area consumed and uniformly fast propagation of signals, including high-fanout signals, throughout the device. The wiring module may contain one or many levels of metal interconnects.

One embodiment of a switch matrix is a 6×5 programmable switch-matrix with 30 SRAM bits (or 30 Anti-fuses, or 30 fuses), shown in FIG. 15. The box 370 in FIG. 15 contains the SRAM cell shown inside dotted box of FIG. 14, where the pass gate makes the connection between the two wires, and the SRAM bit holds the configuration data. In this configuration, the wire connection in circuit 112 occurs via a pass transistor located in circuit 104 controlled by an SRAM cell in circuit 108. During power-up, a permanent non-volatile memory block located in the system, loads the correct configuration data into SRAM cells. In Fuse or Anti-fuse applications, the box simply represents the programmable element in circuit 108 between the two wires in circuit 112. During the ASIC conversion this link is replaced with an open or short between the wires.

Another embodiment provides short interconnect segments that could be joined to each other and to input and output terminals of the logic blocks at programmable interconnection points. In another embodiment, direct connections to adjacent logic blocks can be used to increase speed. For global signals that traverse long distances, longer lines are used. Segmented interconnect structures with routing lines of varied lengths can be used. In yet other embodiments, a hierarchical interconnect structure provides lines of short lengths connectable at boundaries to lines of longer lengths extending between the boundaries, and larger boundaries with lines of even longer length extending between those boundaries. The routing circuit can connect adjacent logic blocks in two different hierarchical blocks differently than adjacent logic blocks in the same hierarchical block. Alternatively, a tile-based interconnect structure can be used where lines of varying lengths in which each tile in a rectangular array may be identical to each other tile. In yet another implementation, the interconnect lines can be separated from the logic block inputs by way of a routing matrix, which gives each interconnect line more flexible access to the logic block inputs. In another embodiment, interconnect routing is driven by programmable buffers. Long wire lengths can be sub-divided into smaller length segments with smaller buffers to achieve a net reduction in the overall wire delay, and to obtain predictable timing in the logic routing of the PLD.

Next, a brief description of the manufacturing process is discussed. During manufacturing, one or more digital circuits can be formed on a substrate. Next, the process selectively fabricates either a memory circuit or a conductive pattern substantially above the digital circuits to control portion of digital circuits. Finally, the process fabricates an interconnect and routing layer substantially above the digital circuits and memory circuits to connect digital circuits and one of the memory circuit or the conductive pattern.

The process can be modified to fabricate a generic field programmable gate array (FPGA) with the constructed memory circuit or an application specific integrated circuit (ASIC) with the constructed conductive pattern. Multiple ASICs can be fabricated with different variations of conductive patterns, each conductive pattern providing a mask ROM to configure logic. The memory circuit and the conductive pattern have one or more substantially matching circuit characteristics. In this case, timing characteristics substantially unchanged by the circuit control option. The process thus fabricates a programmable logic device by constructing digital circuits on a substrate; and constructing a non-planar circuit on the substrate after constructing the digital circuits, the non-planar circuit being either a memory deposited to store data to configure the digital circuits to form a field programmable gate array (FPGA) or a conductive pattern deposited to hard-wire the digital circuits to form an application specific integrated circuit (ASIC), wherein the deposited memory and the conductive pattern have substantially matching timing characteristics. In another embodiment, the hard-wire ASIC option may be incorporated into the digital circuit layer 102. In another embodiment, the hard-wire ASIC option is incorporated into the routing layer 110.

The unique method of constructing a three dimensional array ASIC which is ROM programmable, also allows to assemble multiple ASICs in a single IC by stacking the plurality of ROM layers. Only one logic layer and one interconnect structure is needed for all the ASICs, thereby reducing the equivalent cost of a single ASIC significantly. If 4 ROM layers are stacked to build 4-ASICs in one IC, assuming that each custom metal layer adds 4% overhead, the equivalent ASIC die cost is reduced by 71% to only 0.29×. Furthermore, the assembly cost for the package is now reduced to the cost of a single IC and the board space occupied by the multiple ASICs is reduced to one foot-print. There is tremendous value in saving board space and board level wiring as those add significantly to the cost of the end product.

Although an illustrative embodiment of the present invention, and various modifications thereof, have been described in detail herein with reference to the accompanying drawings, it is to be understood that the invention is not limited to this precise embodiment and the described modifications, and that various changes and further modifications may be effected therein by one skilled in the art without departing from the scope or spirit of the invention as defined in the appended claims.

What is claimed is:

1. A three-dimensional semiconductor device, comprising:

a first module layer having a plurality of circuit blocks; and a second module layer positioned substantially above the first module layer, including a plurality of first configuration circuits to control a portion of the circuit blocks; and a third module layer positioned substantially above the first module layer, including a plurality of second configuration circuits to control said portion of the circuit blocks; and a first global control signal to couple or decouple each of said first configuration circuits from said portion of circuit blocks, and a second global control signal to couple or decouple each of said second configuration circuits from said portion of circuit blocks;

wherein said global control signals instantly select all configuration circuits in one of said modules to control said portion of the circuit blocks.

2. The device of claim 1, wherein the first, second and third module layers form a monolithic structure.

3. The device of claim 1, wherein the first or second or both configuration circuits comprise user configurable Random Access Memory (RAM) elements or mask configured Read Only Memory (ROM) elements.

4. The device of claim 3, wherein the RAM element is selected from one of fuse links, anti-fuse capacitors, SRAM cells, DRAM cells, metal optional links, EPROM cells, EEPROM cells, flash cells, ferro-electric elements, optical elements, electro-chemical elements and magnetic elements.

5. The device of claim 3, wherein the RAM memory element comprises one device selected from the following: diode, transistor, thin film device, thin film resistor, thin film capacitor, thin film transistor (TFT).

6. The device of claim 3, wherein the ROM element is comprised of:

a wire connection to a power-bus to provide a logic one data storage; and a wire connection to a ground-bus to provide a logic zero data storage.

7. The device of claim 1 further comprising a fourth module layer formed substantially above the first, second and third module layer, wherein interconnect and routing signals are formed to connect the circuit blocks within the first, second and third module layers.

8. The device of claim 7, wherein the second and third module layers contain isolated through connections to connect the first module layer directly from the fourth module layer.

9. The device of claim 1 further comprising a fourth module layer formed substantially below the second and third module layer but above the first module layer, wherein interconnect and routing signals are formed to connect the circuit blocks within the first, second and third module layers.

10. The device of claim 1 further comprising K additional module layers, sequentially positioned one above the other, all above said third module layer, wherein each of K additional module layers comprises a plurality of configuration circuits to control said portion of the circuit blocks, and wherein said one or more of the global control signals instantly select all configuration circuits in the (K+2) modules to control said portion of the circuit blocks.

11. The device of claim 1, wherein the circuit blocks further comprise programmable logic circuits including programmable pass gate logic elements and programmable inverter logic elements.

12. A programmable storage unit in an integrated circuit that generates an output coupled to a high impedance device, said storage unit comprising:
 a first select device coupled to said output; and
 a first configuration memory circuit coupled to said first select device; and
 a first control signal coupled to said first select device to selectively couple or decouple said first configuration memory circuit from said output; and
 a second select device coupled to said output; and
 a second configuration memory circuit coupled to said second select device; and
 a second control signal coupled to said second select device to selectively couple or decouple said second configuration memory circuit from said output;
 wherein, the high impedance device is located in a first module layer, the first configuration memory circuit is located in a second module layer positioned above said first module layer, and the second configuration memory circuit is located in a third module layer positioned above said second module layer; and
 wherein, the output value can be switched between the first and second configuration memory bits instantly by activating said first or second control signal respectively.

13. The device of claim 12, wherein the high impedance device is a pass-gate logic element comprising:
 a first electrode coupled to a first node; and
 a second electrode coupled to a second node; and
 a gate electrode coupled to said output, wherein a logic one on the output connects the first node to second node, and a logic zero on the output disconnects said first node from said second node.

14. The device of claim 12, wherein the high impedance device is an inverter comprising:
 an inverter input coupled to said storage unit output; and
 an inverter output capable of driving a logic state, wherein a logic one on the storage output drives a logic zero state, and a logic zero on the storage output drives a logic one state.

15. The device of claim 12, wherein the first and second select devices are located in said first module layer.

16. The device of claim 12, wherein the first select device is located in said second module layer and the second select device is located in said third module layer.

17. The device of claim 12, wherein the first or second or both configuration memory circuits comprises either user configurable Random Access Memory (RAM) elements or mask configured Read Only Memory (ROM) elements.

18. An alterable application specific integrated circuit (ASIC) that can instantly switch between N independently stored logic applications, wherein N is an integer value greater than one, the ASIC comprising:
 a plurality of programmable N-bit storage units, each unit generating a single output that couples to a high impedance device, each storage unit comprised of:
  a first storage state comprising:
   a first select device coupled to said output; and
   a first configuration memory circuit coupled to said first select device; and
   a first control signal coupled to said first select device to selectively couple or decouple said first configuration memory circuit from said output; and
  a second storage state comprising:
   a second select device coupled to said output; and
   a second configuration memory circuit coupled to said second select device; and
   a second control signal coupled to said second select device to selectively couple or decouple said second configuration memory circuit from said output; and
  additional (N−3) similar storage states; and
  an $N^{th}$ storage state comprising:
   an $N^{th}$ select device coupled to said output; and
   an $N^{th}$ configuration memory circuit coupled to said $N^{th}$ select device; and
   an $N^{th}$ control signal coupled to said $N^{th}$ select device to selectively couple or decouple said $N^{th}$ configuration memory circuit from said output; and
 a first global control signal, said signal comprised of coupling together the first control signal of every storage unit in the first storage state; and
 a second global control signal, said signal comprised of coupling together the second control signal of every storage unit in the second storage state; and
 additional (N−3) similar global control signals; and
 an $N^{th}$ global control signal, said signal comprised of coupling together the $N^{th}$ control signal of every storage unit in the $N^{th}$ storage state;
 wherein, the plurality of high impedance devices are located in a first module layer, the plurality of first configuration memory circuits are located in a second module layer positioned above said first module layer, and the plurality of second configuration memory circuits are located in a third module layer positioned above said second module layer, and so forth sequential positioning for additional (N−3) module layers, and the plurality of $N^{th}$ configuration memory circuits are located in an $N^{th}$ module layer positioned above the (N−1) module layer; and
 wherein, activating one of said first thru $N^{th}$ global control signals enables instant switching between the N stored logic applications.

19. The device of claim 18, wherein a first portion of the high impedance devices are pass-gate logic elements, and a second portion of the high impedance devices are inverters.

20. The device of claim 18, wherein the configuration memory circuits in the $K^{th}$ module layer comprises either user configurable Random Access Memory (RAM) elements or mask configured Read Only Memory (ROM) elements, wherein K is any integer value from 1 to N.

* * * * *